US00RE50236E

(19) United States
(12) Reissued Patent
Kamimura

(10) Patent Number: US RE50,236 E
(45) Date of Reissued Patent: Dec. 10, 2024

(54) ELECTRONIC DEVICE

(71) Applicant: KIOXIA CORPORATION, Tokyo (JP)

(72) Inventor: Naoya Kamimura, Yokohama (JP)

(73) Assignee: KIOXIA CORPORATION, Tokyo (JP)

(21) Appl. No.: 17/363,733

(22) Filed: Jun. 30, 2021

Related U.S. Patent Documents

Reissue of:
(64) Patent No.: 9,609,739
Issued: Mar. 28, 2017
Appl. No.: 14/838,581
Filed: Aug. 28, 2015

U.S. Applications:
(63) Continuation of application No. 16/038,299, filed on Jul. 18, 2018, now Pat. No. Re. 48,664, which is an application for the reissue of Pat. No. 9,609,739.
(Continued)

(51) Int. Cl.

| | |
|---|---|
| ***H05K 7/20*** | (2006.01) |
| ***H01L 23/473*** | (2006.01) |
| ***H05K 1/02*** | (2006.01) |
| ***H05K 1/18*** | (2006.01) |
| ***H05K 5/02*** | (2006.01) |

(52) U.S. Cl.
CPC ..... *H05K 1/0203* (2013.01); *H05K 1/18* (2013.01); *H05K 5/0213* (2013.01)

(58) Field of Classification Search
CPC ..... H05K 1/18; H05K 1/0203; H05K 5/0213; H05K 7/20409; H05K 7/20009; H05K 7/20381; H05K 7/20418
See application file for complete search history.

(56) References Cited

U.S. PATENT DOCUMENTS

| | | |
|---|---|---|
| 5,773,886 A | 6/1998 | Rostoker |
| 6,622,786 B1 | 9/2003 | Calmidi |

(Continued)

FOREIGN PATENT DOCUMENTS

| | | |
|---|---|---|
| JP | 2008-244104 | 10/2008 |
| JP | 2010-109333 | 5/2010 |
| JP | 2011507152 | * 3/2011 |

*Primary Examiner* — Linh M Nguyen
(74) *Attorney, Agent, or Firm* — Oblon, McClelland, Maier & Neustadt, L.L.P.

(57) ABSTRACT

According to one embodiment, an electronic device according to an embodiment includes, for example, a board, a first electronic component, and a heat dissipation member. The board includes a first face. The heat dissipation member is disposed at a side opposite to the first face of the first electronic component. The heat dissipation member is thermally connected to the first electronic component. The heat dissipation member includes a first extending portion, a second extending portion, and a plurality of third extending portions. The first extending portion extends along the first face. The second extending portion is positioned away, in a direction that intersects the first face, from the first extending portion by a space. The second extending portion extends along the first face. The plurality of the third extending portions are connected to the first extending portion and the second extending portion. The plurality of the third extending portions are positioned away from each other by a space.

21 Claims, 9 Drawing Sheets

Related U.S. Application Data

(60) Provisional application No. 62/131,077, filed on Mar. 10, 2015.

(56) References Cited

U.S. PATENT DOCUMENTS 7,932,597 B2 4/2011 Terui et al.
8,154,116 B2 4/2012 Sasaki et al.
8,213,180 B2 7/2012 Zhao et al.
RE48,664 E * 7/2021 Kamimura ..... H05K 1/18
2002/0131240 A1* 9/2002 Kim ..... H01L 23/3677 361/719
2003/0131973 A1 7/2003 Nair
2003/0171033 A1* 9/2003 Bright ..... G02B 6/4201 439/607.25
2004/0012939 A1* 1/2004 Ta ..... H05K 9/0016 361/800
2004/0136164 A1* 7/2004 Morris ..... H05K 1/141 361/721
2004/0182552 A1* 9/2004 Kubo ..... H01L 23/3672 165/104.33
2005/0207115 A1* 9/2005 Barsun ..... G06F 1/20 361/690
2006/0023425 A1* 2/2006 Iijima ..... F04D 13/0673 361/699
2007/0097653 A1 5/2007 Gilliland
2007/0108599 A1* 5/2007 Im ..... H01L 23/142 257/712
2007/0127210 A1* 6/2007 Mahalingam ..... G06F 1/20 361/700
2008/0024993 A1* 1/2008 Chu ..... H01L 23/367 361/709
2008/0105969 A1* 5/2008 Hsu ..... H01L 23/3677 257/712
2008/0237846 A1* 10/2008 Terui ..... H01L 23/42 257/717
2008/0258241 A1* 10/2008 Sutardja ..... H01L 23/5386 257/401
2009/0121352 A1* 5/2009 Lin ..... H01L 23/367 257/737
2009/0152714 A1* 6/2009 Yamagishi ..... H01L 24/83 257/724
2009/0236076 A1* 9/2009 Min ..... F28D 15/0275 165/80.3
2010/0006260 A1* 1/2010 Oh ..... H01L 23/3672 165/80.2
2010/0109137 A1* 5/2010 Sasaki ..... H01L 23/367 257/684
2011/0069449 A1* 3/2011 Miller ..... H05K 7/20145 361/692
2011/0176279 A1* 7/2011 Zhao ..... H01L 21/4878 361/720
2011/0214904 A1 9/2011 Ohsawa
2012/0169614 A1* 7/2012 Oberpriller ..... G06F 1/1656 345/173
2012/0223444 A1* 9/2012 Yamagishi ..... H01L 24/83 257/787
2012/0229983 A1* 9/2012 Nakajima ..... H05K 7/20336 361/697
2013/0077253 A1* 3/2013 Macall ..... G02B 6/4261 361/715
2013/0093074 A1* 4/2013 Grant ..... H01L 23/3675 257/693
2013/0107137 A1* 5/2013 Nonomura ..... H04N 5/64 348/836
2014/0060783 A1* 3/2014 Ciulla ..... F04B 43/046 165/109.1
2014/0168896 A1* 6/2014 Fujiwara ..... G06F 1/20 361/697
2014/0217575 A1* 8/2014 Hung ..... H01L 21/50 257/713
2014/0217620 A1* 8/2014 Yamagishi ..... H01L 23/315 257/787

* cited by examiner

ELECTRONIC DEVICE

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

*More than one reissue application has been filed for the reissue of U.S. Pat. No. 9,609,739. The reissue applications are application Ser. No. 16/038,299 filed Jul. 18, 2018, now U.S. Pat. No. RE 48,664, and the present application, application Ser. No. 17/363,733 filed Jun. 30, 2021, which is a Continuation Reissue Application of application Ser. No. 16/038,299.*

CROSS-REFERENCE TO RELATED APPLICATIONS

This application is based upon and claims the benefit of priority from U.S. Provisional Application No. 62/131,077, filed on Mar. 10, 2015; the entire contents of which are incorporated herein by reference.

FIELD

Embodiments described herein relate generally to an electronic device.

BACKGROUND

There is a known electronic component in which a heat sink is mounted and heat dissipation performance is improved.

It is meaningful to provide a heat dissipation member having higher heat dissipation performance, and an electronic device including such a heat dissipation member.

DETAILED DESCRIPTION

In general, according to one embodiment, an electronic device according to an embodiment includes, for example, a board, a first electronic component, and a heat dissipation member. The board includes a first face. The heat dissipation member is disposed at a side opposite to the first face of the first electronic component. The heat dissipation member is thermally connected to the first electronic component. The heat dissipation member includes a first extending portion, a second extending portion, and a plurality of third extending portions. The first extending portion extends along the first face. The second extending portion is positioned away, in a direction that intersects the first face, from the first extending portion by a space. The second extending portion extends along the first face. The plurality of the third extending portions are connected to the first extending portion and the second extending portion. The plurality of the third extending portions are positioned away from each other by a space.

In the following, exemplary embodiments of the electronic device and the heat dissipation member will be disclosed. Configurations and control (technical characteristics) of the following embodiments described below, and functions and results (effects) provided by such configurations and control are examples. Further, a plurality of embodiments and a modified example exemplified below include same components. In the following, the same components are denoted by same references sings, and repetition of description will be omitted.

In the respective drawings, directions are indicated for the sake of convenience. An X-direction and a Y-direction are directions along a face 3a of a circuit board 3 (board, refer to FIG. 2) and intersect each other. One of the X-direction and the Y-direction may be referred to as a row direction, and the other may be referred to as a column direction. One of the X-direction and the Y-direction may be referred to as a vertical direction, and the other may be referred to as a horizontal direction. A Z-direction is a direction that intersects the face 3a, and may be referred to as a thickness direction or a height direction of a housing 2, the circuit board 3, and an electronic component 4. The X-direction, Y-direction, and Z-direction are orthogonal to each other.

First Embodiment

Figure 1:
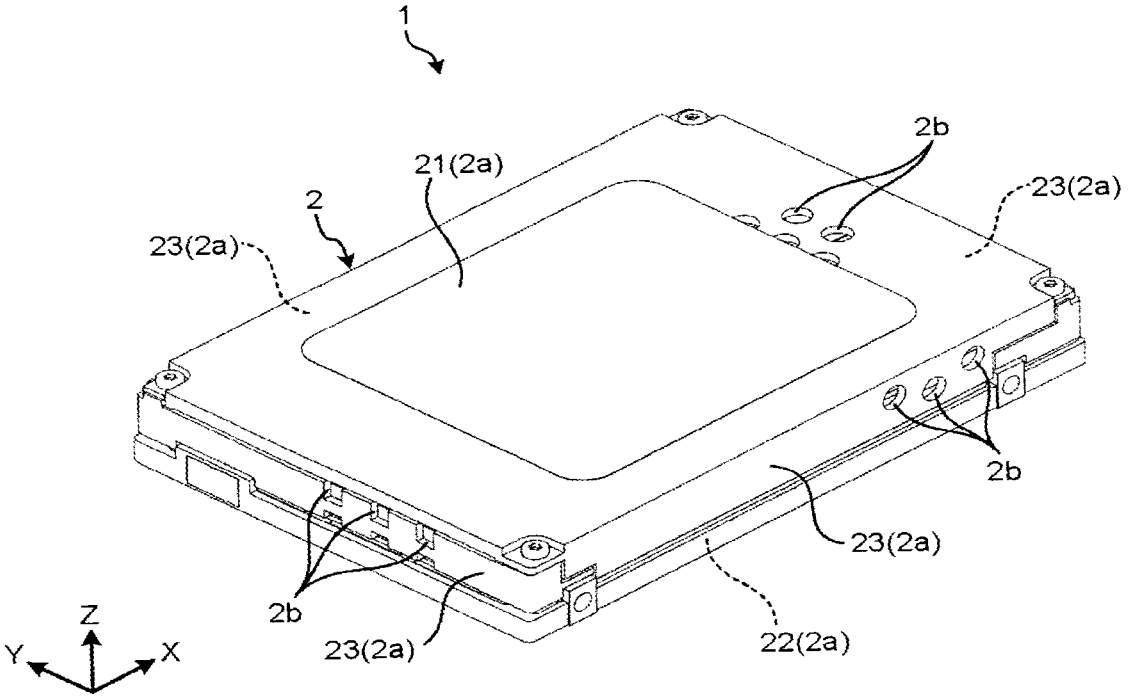
FIG. 1 is an exemplary schematic perspective view illustrating an electronic device according to an embodiment.

FIG. 1 is an exemplary schematic perspective view illustrating an electronic device according to an embodiment. An electronic device 1 according to the present embodiment includes a housing 2 shaped in a flat thin rectangular parallelepiped as exemplified in FIG. 1. The housing 2 may be formed of, for example, metallic material such as aluminum alloy and magnesium alloy, or synthetic resin material. For the housing 2, a member having relatively high thermal conductivity may be partially or entirely used. The housing 2 has a plurality of walls 2a. Each of the plurality of walls 2a is formed in a square plate shape. The walls 2a include two walls 21, 22 and four walls 23. The two walls 21, 22 are each formed along the X-direction and the Y-direction, further parallel to each other, and positioned away from each other in the Z-direction. The four walls 23 surround sides. The four walls 23 are formed along the Z-direction, and further orthogonal to the X-direction and the Y-direction. Among the four walls 23, two walls 23 apart from each other in the X-direction are formed along the Y-direction and the Z-direction. Further, among the four walls 23, two walls 23 apart from each other in the Y-direction are formed along the X-direction and the Z-direction.

Additionally, the wall 2a is provided with an opening 2b. The opening 2b penetrates the wall 2a in a thickness direction of the wall 2a, and connects an interior and an exterior of the housing 2. The opening 2b is, for example, a through hole, a notch, and a slit. The opening 2b may be used to, for example, insert and pass an external component such as a connector, expose an internal component such as a connector or an indicator (light emitting portion), and ventilate air.

The electronic device 1 is, for example, a solid state drive (SSD). The SSD may be also referred to as a silicon drive, a flash drive, and so on. Note that the electronic device 1 may be, for example, an electronic device other than the SSD, such as a personal computer, a smartphone, a smart-television, a smartbook, a cellular phone, a personal digital assistant (PDA), an image display device, and a video telephone set.

Figure 2:
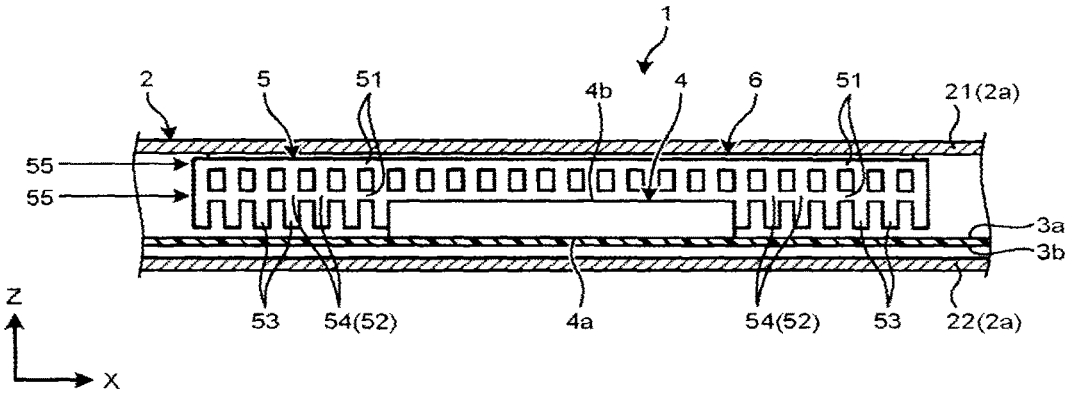
FIG. 2 is an exemplary schematic cross-sectional view illustrating a portion of the electronic device according to a first embodiment.

FIG. 2 is an exemplary schematic cross-sectional view illustrating a portion of the electronic device according to the first embodiment; As illustrated in FIG. 2, the circuit board 3 and the electronic component 4 are housed inside the housing 2 of the electronic device 1. The circuit board 3 (board) is, for example, a rigid printed wiring board, and formed as a multi-layer board, a subcomposite, a coreless board, and so on. The circuit board 3 includes an insulator and a conductor. The insulator may be formed of synthetic resin material having insulation properties, ceramic, and so on. Further, the conductor may be a conductor pattern (wiring pattern), a conductor layer, a wire, a through-hole, a via, a through-electrode, and so on. The circuit board 3 is rectangular (square) and formed in a plate shape. Further, the circuit board 3 includes a face 3a and a face 3b. The face 3a and the face 3b are positioned on the sides opposite to each other in a thickness direction (Z-direction) of the circuit board 3. The thickness direction is a direction orthogonal to the face 3a and the face 3b. The face 3a is an example of a first face.

The electronic component 4 (first electronic component) is disposed on the face 3a. The electronic component 4 is a face mount component provided on the face 3a by a face mount technology. More specifically, the electronic component 4 may be formed as a land grid array (LGA), a ball grid array (BGA), and a chip size package (CSP), for example. Note that the electronic component 4 is not necessarily the face mount component. The electronic component 4 may also be referred to as a package. Further, the electronic component 4 thermally connected with a heat dissipation member may be an electronic component (package) other than the SSD, such as a central processing unit (CPU).

The electronic component 4 includes a face 4a and a face 4b. The face 4a faces the face 3a of the circuit board 3. The face 4b is positioned at a side opposite to the face 4a in the thickness direction (Z-direction) of the electronic component 4 and the circuit board 3. Further, according to the present embodiment, the electronic component 4 is disposed on the face 3a of the circuit board 3, and not disposed on the face 3b. Therefore, the face 3a may be referred to as a component mounting face, and the face 3b may be referred to as a non-component mounting face. Note that the electronic component 4 may also be disposed on the face 3b, or the electronic component 4 may be disposed on each of the face 3a and the face 3b. In this case, a heat dissipation member 5 may also be disposed at the electronic component on each of the face 3a and the face 3b. The thickness direction is the direction orthogonal to the face 4a and the face 4b.

Figure 3:
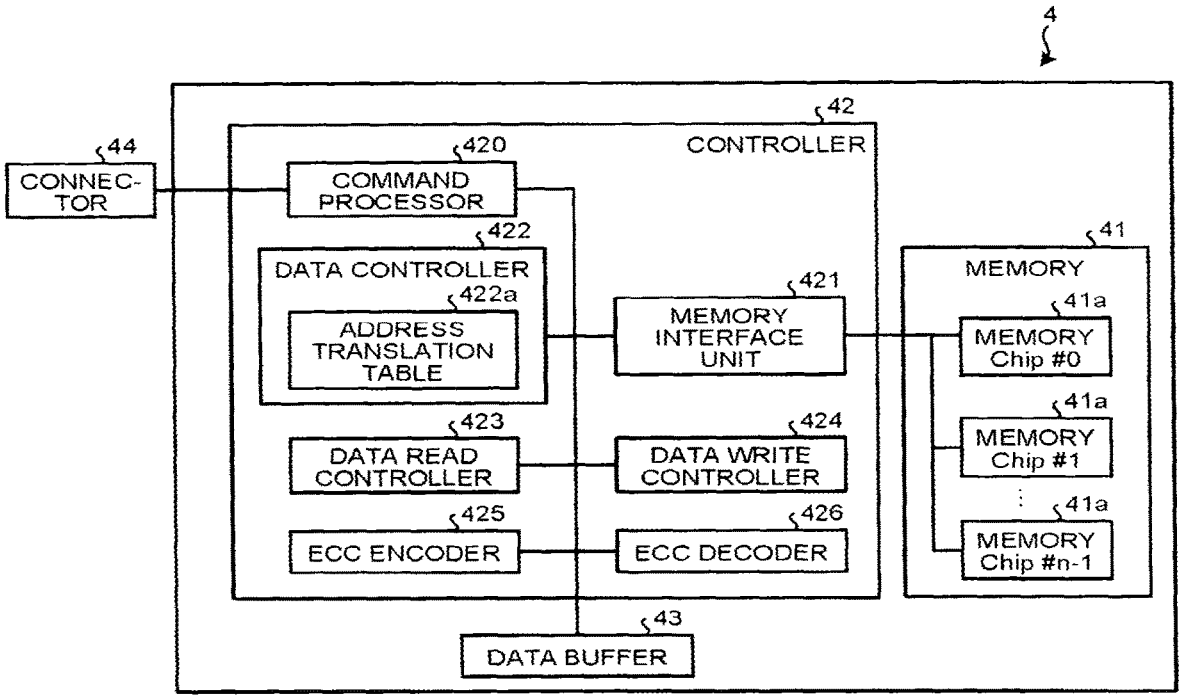
FIG. 3 is an exemplary schematic block diagram illustrating an electronic component according to an embodiment.

FIG. 3 is an exemplary schematic block diagram illustrating a controller included in a semiconductor device according to an embodiment. As illustrated in FIG. 3, the electronic component 4 may be formed as a package SSD (package) including, for example, a memory 41, a controller 42, and a data buffer 43.

The memory 41 is a non-volatile memory such as a NAND flash memory. The memory 41 is not limited to the NAND flash memory, and may be a magnetoresistive random access memory (MRAM), a resistance random access memory (RERAM), a ferroelectric random access memory (FERAM), and so on. Further, the memory 41 stores user data transmitted from the outside (host device) of the semiconductor device 1, system data used only inside the electronic component 4, and so on. Furthermore, the memory 41 includes a memory cell array in which a plurality of memory cells (not illustrated) is arrayed in a matrix form. Each of the memory cells can store two value or multiple values. Additionally, the memory 41 includes a plurality (n) of memory chips 41a (#0 to #n−1).

The data buffer 43 temporarily holds data. The data buffer 43 is, for example, a dynamic static random access memory (DRAM). Note that the data buffer 43 is not limited to the DRAM, and may be a static random access memory (SRAM) or the like. The data buffer 43 may be provided independently from the controller 42, or may be implemented as an incorporated memory inside a chip of the controller 42.

The controller 42 controls the electronic component 4. Functions of the controller 42 are implemented by, for example, a processor configured to execute firmware stored in the memory 41 or a read only memory (ROM) included in the controller 42, or hardware. The controller 42 reads data from the memory 41 and writes data in the memory 41 in accordance with a command from the host device.

Further, the controller 42 includes, for example, a command processor 420, a memory interface unit 421, a data controller 422, a data read controller 423, a data write controller 424, an ECC encoder 425, and an ECC decoder 426.

The command processor 420 determines a command received from the host. The commands includes, for example, a read command, a write command, a command to retrieve individual information, and a command to change setting values in order to control various kinds of operation. The controller 42 executes processing in accordance with the command determined by the command processor 420.

The memory interface unit 421 is a controller to control the memory 41. The memory interface unit 421 writes, in the memory 41, a code word received from the ECC encoder 425 in accordance with control of the data write controller 424 and the like. Further, the memory interface unit 421 reads the code word from the memory 41 in accordance with control of the data read controller 423 and the like, and transfers the same to the ECC decoder 426.

The data controller 422 controls a position where data is to be stored on the memory 41. The data controller 422 has an address conversion table 222a in which a logic address provided from the host device is correlated to a physical position on the memory 41, and executes garbage collection in accordance with a block usage condition on the memory.

The data read controller 423 executes processing to read data from the memory 41 in accordance with a command notified from the host device via a connector 44. More specifically, the data read controller 423 acquires, from the data controller 422, a physical position on the memory 41 corresponding to a logic address of read data, and notifies the memory interface unit 421 of the physical position. The read data is transmitted to the host device via the ECC decoder 426, data buffer 43, and so on.

The data write controller 424 executes processing to write data in the memory 41 in accordance with a command notified from the host device via the connector 44. More specifically, the data write controller 424 acquires, from the data controller 422, a physical position on the memory 41 where the data is to be written, and outputs the physical position and a code word output from the ECC encoder 425 to the memory interface unit 421.

The ECC encoder 425 encodes the data held at the data buffer 43, and generates a code word including data and a redundant portion (parity). The ECC decoder 426 acquires, from the memory interface unit 421, the code word read from the memory 41, and decodes the acquired code word. The ECC decoder 426 notifies the data read controller 423 of a read error in the case of failing in error correction at the time of decoding. Further, the electronic component 4 may be other a controller not including a memory, or other electronic components that generate heat, such as a CPU and an amplifier. The electronic component 4 is the component that generates a large amount of heat, compared to other components inside the housing 2. The electronic component 4 may also be referred to as a heating element.

Figure 4:
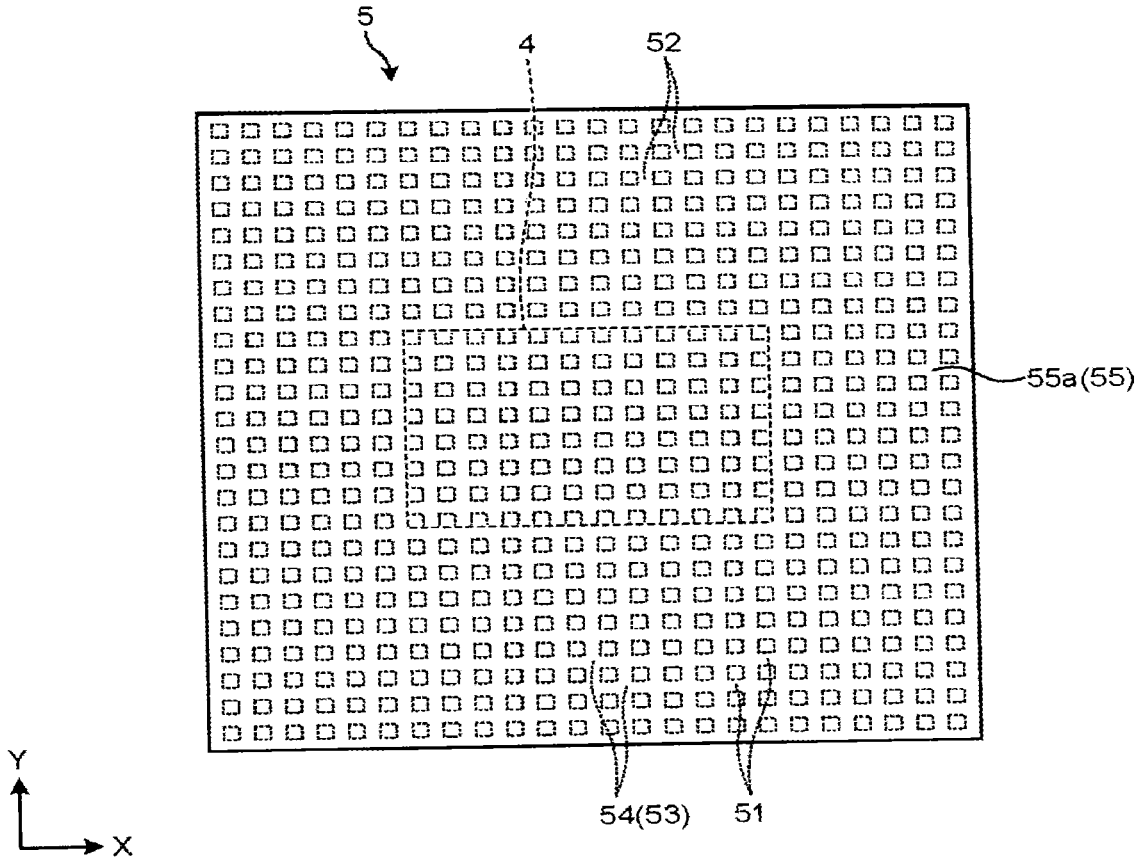
FIG. 4 is an exemplary schematic plan view illustrating a heat dissipation member according to the first embodiment.
Figure 5:
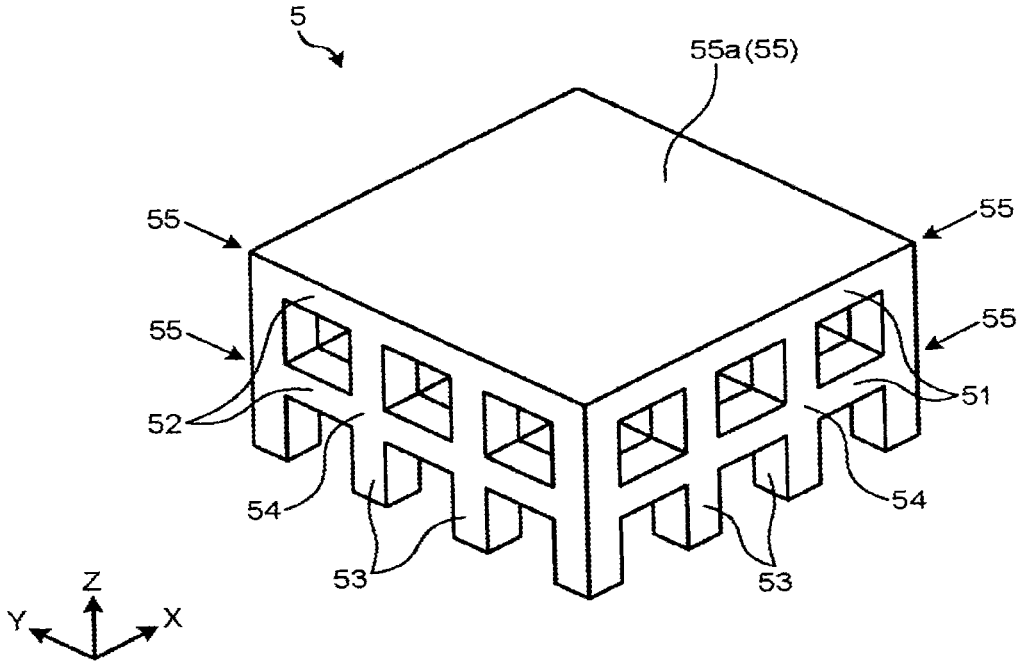
FIG. 5 is an exemplary schematic perspective view illustrating a portion of the heat dissipation member according to the first embodiment.

FIG. 4 is an exemplary schematic plan view illustrating the heat dissipation member according to the first embodiment. FIG. 5 is an exemplary schematic perspective view illustrating a portion of the heat dissipation member according to the first embodiment. The heat dissipation member 5 is provided on a face 4b of the electronic component 4 as illustrated in FIGS. 2, 4, and 5. In other words, the heat dissipation member 5 is disposed at a side opposite to the circuit board 3 of the electronic component 4. The heat dissipation member 5 is brought into close contact with the face 4b of the electronic component 4. The heat dissipation member 5 may be mounted on the face 4b by bonding, for example. Further, the heat dissipation member 5 is disposed between the electronic component 4 and the wall 21 of the housing 2. The heat dissipation member 5 is thermally connected to the electronic component 4. Therefore, heat generated at the electronic component 4 is transmitted to the heat dissipation member 5. By heat exchanging air with the heat dissipation member 5, heat is transmitted to the air from the heat dissipation member 5. Further, the heat dissipation member 5 is thermally connected to the wall 21 of the housing 2. Therefore, heat generated at the electronic component 4 is transmitted to the wall 21 via the heat dissipation member 5. The heat is transmitted from the wall 21 to the air by heat exchanging the air with the wall 21. Therefore, temperature at the electronic component 4 is easily decreased, compared to a structure not provided with the heat dissipation member 5. Note that a heat conductive material 6 is interposed between the heat dissipation member 5 and the wall 21. The heat conductive material 6 may have, for example, elasticity, flexibility, or cushioning properties. The heat conductive material 6 is softer, less elastic modulus, and more flexible, compared to the wall 21 and the electronic component 4. The heat conductive material 6 may be fixed to the electronic component 4 or the wall 21 by bonding, for example.

Further, as illustrated in FIGS. 2, 4, and 5, the heat dissipation member 5 includes a plurality of layers 55 (levels). In other words, the heat dissipation member 5 has a multi-layer structure or a multi-level structure. The layers 55 are each expanded in the X-direction and Y-direction. According to the present embodiment, the heat dissipation member 5 includes two layers 55, but may include the three or more layers 55. Further, the plurality of layers 55 is positioned away from each other in the Z-direction by a space (air). The heat dissipation member 5 having the multi-layer structure has a face area, namely, a contact area with the air larger than a face area of a heat dissipation member having a single-layer structure. Therefore, according to the present embodiment, the heat dissipation member 5 having higher heat dissipation performance is easily obtained. Among the two layers 55, the layer 55 close to the circuit board 3 is an example of the first extending portion, and the layer 55a (55) distant from the circuit board 3 is an example of the second extending portion. Further, according to the present embodiment, the layer 55a distant from the circuit board 3 is plate-shaped, but may also be mesh-shaped.

Further, the heat dissipation member 5 has a framework structure as illustrated in FIGS. 2, 4, and 5. As illustrated in FIG. 5, the heat dissipation member 5 includes a plurality of nodes 54 in which a plurality of frames 51, 52, 53 gathers. The frame 51 extends along the X-direction, the frame 52 extends along the Y-direction, and the frame 53 extends along the Z-direction. The heat dissipation member 5 has a three-dimensional lattice shape formed by connecting the plurality of frames 51, 52, 53 via the plurality of nodes 54. Note that the frames 51, 52, 53 are defined as an interval between a node 54 and another node 54, or an interval from a node 54 to a free end. In this structure, the node 54 is an example of a connecting portion. Further, according to the present embodiment, the frame 51 extended along the X-direction is an example of a row portion, the frame 52 extended along the Y-direction is an example of a column portion, and the frame 53 extended along the Z-direction is an example of the third extending portion. Further, in the layer 55 on a side close to the electronic component 4 among the two layers 55, 55 adjacent to each other in the Z-direction at an interval, the frame 51 is an example of a row portion, the frame 52 is an example of a column portion, and the node 54 is an example of a connecting portion. Note that the row portion and the column portion may be reversed. According to the above-described framework structure (three-dimensional lattice shape), the contact area with the air tends to be formed further larger. Therefore, according to the present embodiment, the heat dissipation member 5 having higher heat dissipation performance is easily obtained. Further, the framework structure also provides some effects that, for example, a weight of the heat dissipation member 5 is reduced, and the heat dissipation member 5 becomes more easily elastically deformed and becomes more flexible. Further, since the three-dimensional lattice shape has regularity in the shape, a plurality of the heat dissipation members 5 having different sizes can be obtained by cutting out from a large framework structure, for example. Therefore, labor and cost for manufacture may be easily reduced. Note that the heat dissipation member 5 is not limited to a rigid-frame structure, and may be a framework structure different from the three-dimensional lattice shape such as a truss-like structure. Further, the heat dissipation member 5 may have the framework structure (three-dimensional lattice shape) not entirely but partially. Moreover, directions of the frames 51, 52, 53 may be directions oblique to the X-direction, Y-direction, or Z-direction. Additionally, the frames 51, 52, 53 may not be orthogonal to each other but may be disposed oblique to each other. Further, a repetitive unit shape by the frame is not limited to a cube, and may be various kinds of shape such as a rectangular parallelepiped. Also, the plurality of frames may include a portion in which a hexagonal shape and other polygonal shapes are combined. Additionally, the frame may be curved, and the node may be formed planar or massive. Further, the heat dissipation member may be porous. Furthermore, the number of the layers of the heat dissipation member may be three or more, and multiple levels of air passages may be provided at the heat dissipation member.

Additionally, the heat dissipation member 5 may be formed by integrally connecting a plurality of components (split bodies). As an example, each of the plurality of components may be formed of a structure including the layer 55 and the plurality of frames 53. Further, the plurality of components may be connected by, for example, bonding, welding, or soldering. Furthermore, the heat dissipation member 5 may be manufactured as a layered modeled object by using a layered modeling device (3D printer), or may be manufactured by combining molding and cutting work. Note that the heat dissipation member 5 may be formed by including material having relatively high thermal conductivity, for example, metallic material such as copper-based material, aluminum-based material, and iron-based material, or synthetic resin material including a thermal conductive filler.

As described above, according to the present embodiment, the heat dissipation member 5 includes the plurality of layers 55 (first extending portion and second extending portion) disposed away from each other by a space in the Z-direction (second direction) that intersects the face 3a of the circuit board 3, and the plurality of layers 55 is mutually connected with the frame 53 (third extending portion) extended along the Z-direction. Therefore, according to the present embodiment, for example, the heat dissipation member 5 having the larger face area and higher heat dissipation performance, therefore the electronic device 1 provided with the electronic component 4 having the improved heat dissipation performance can be easily obtained.

Further, according to the present embodiment, the heat dissipation member 5 has the framework structure. Therefore, the heat dissipation member 5 having the larger face area and much higher heat dissipation performance, therefore the electronic device 1 provided with the electronic component 4 having the more improved heat dissipation performance can be easily obtained. Further, the heat dissipation member 5 may be formed having less weight and more easily bendable, for example.

Moreover, in the case where the heat dissipation member 5 has the three-dimensional lattice shape including the three frames 51, 52, 53 formed along the three directions (X-direction, Y-direction, and Z-direction) orthogonal to each other, not only manufacture may be facilitated but also labor and cost for manufacturing the electronic device 1 may be reduced.

Second Embodiment

Figure 6:
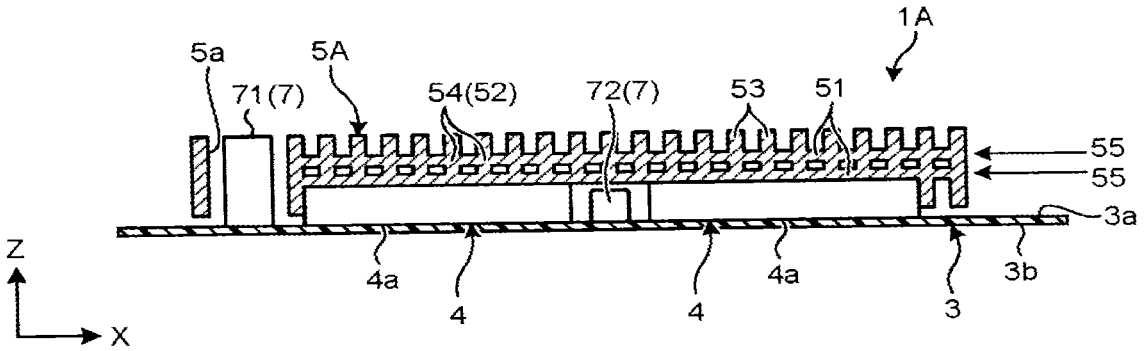
FIG. 6 is an exemplary schematic side view illustrating a board assembly including a heat dissipation member according to a second embodiment.
Figure 7:
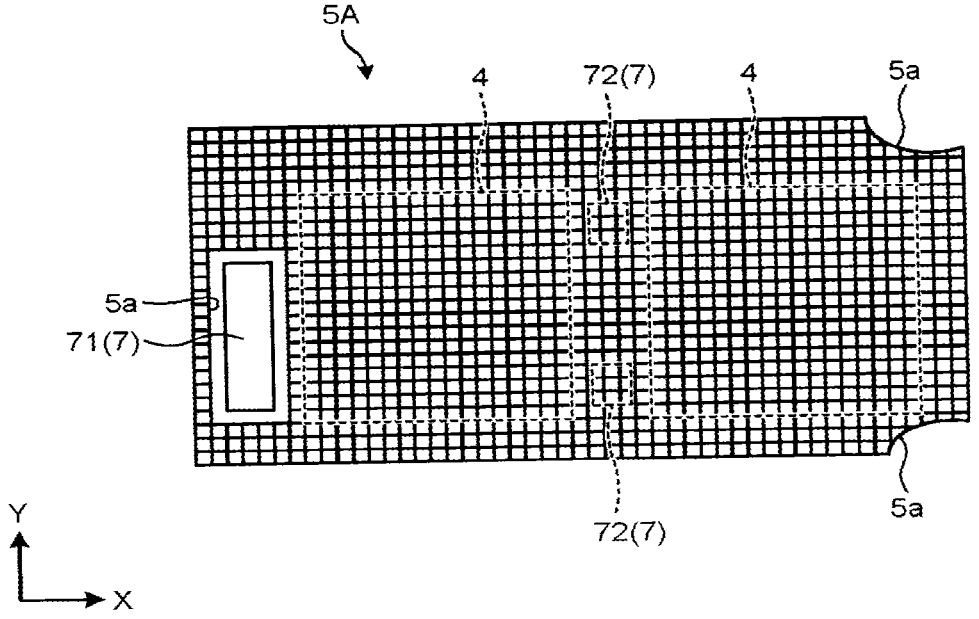
FIG. 7 is an exemplary schematic plan view illustrating a heat dissipation member including the heat dissipation member according to the second embodiment.

FIG. 6 is an exemplary schematic side view illustrating a board assembly including a heat dissipation member according to a second embodiment. FIG. 7 is an exemplary schematic plan view illustrating a heat dissipation member including the heat dissipation member according to the second embodiment. A heat dissipation member 5A according to the second embodiment illustrated in FIGS. 6 and 7 also has a multi-layer structure and a framework structure (three-dimensional lattice shape) same as a heat dissipation member 5 of a first embodiment. Therefore, same effects based on the same structures as the first embodiment can be also obtained in an electronic device 1A according to the present embodiment. However, the heat dissipation member 5A of the present embodiment differs from the first embodiment in points of covering a plurality of electronic components 4 (first electronic component and second electronic component) and being thermally connected to the plurality of electronic components 4. With this structure, labor and cost for manufacture are easily reduced, compared to a case where the heat dissipation member is mounted on each of the plurality of electronic components 4, for example. Further, an interval between the two electronic components 4 can be shortened. As a result, the electronic device 1A may be formed more downsized.

Further, as illustrated in FIGS. 6 and 7, the heat dissipation member 5A is provided with an opening 5a. The opening 5a is, for example, a through hole, a slit, a notch, and a recessed portion. Clearance is provided between a component 71 and the heat dissipation member 5A by the opening 5a. In other words, interference between the component 71 (7) and the heat dissipation member 5A is prevented by the opening 5a, and further heat transmission between the heat dissipation member 5A and the component 71 is suppressed. The openings 5a may be provided at various positions of the heat dissipation member 5A. Further, a heat insulation member (heat blocking member) may also be provided at the opening 5a between the heat dissipation member 5A and the component 71. The opening 5a is useful in the case where the component 71 (7) taller than the electronic component 4 is implemented on a face 3a of a circuit board 3. The opening 5a is an example of a first opening.

Further, as illustrated in FIG. 6, according to the present embodiment, a component 72 is disposed on the face 3a between the two electronic components 4, 4 thermally connected to the heat dissipation member 5A. Clearance is provided between the component 72 and the heat dissipation member 5A. Therefore, even when the heat dissipation member 5A is disposed across the two electronic components 4, 4 like the present embodiment, space between the two electronic components 4, 4 can be more effectively used. Therefore, according to this structure, package density of the components tends to be higher, for example. Further, heat transmission between the heat dissipation member 5A and the component 72 is suppressed by this structure. Note that the component 72 provided with the clearance between the heat dissipation member 5A is disposed between three or more electronic components 4, and the heat dissipation member 5A may also be disposed so as to cover the component 72. Further, the components 7 (71, 72) are, for example, components having an amount of heat generation smaller than that of the electronic component 4 in which heat is dissipated by the heat dissipation member 5A, more specifically, electronic components such as a capacitor, a resistor, and a connector. Additionally, the component 7 may be, for example, a component other than the electronic component, for example, a fixing tool such as a screw, and a pressing member.

Third Embodiment

Figure 8:
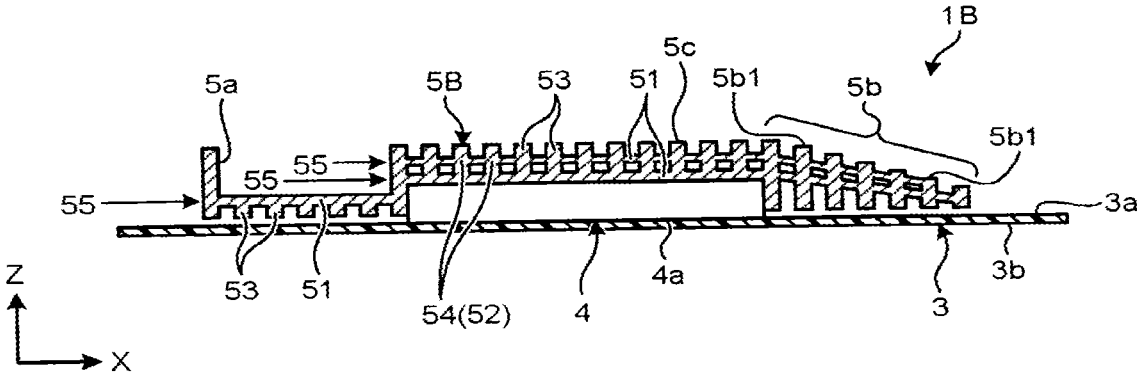
FIG. 8 is an exemplary schematic side view illustrating a board assembly including a heat dissipation member according to a third embodiment.
Figure 9:
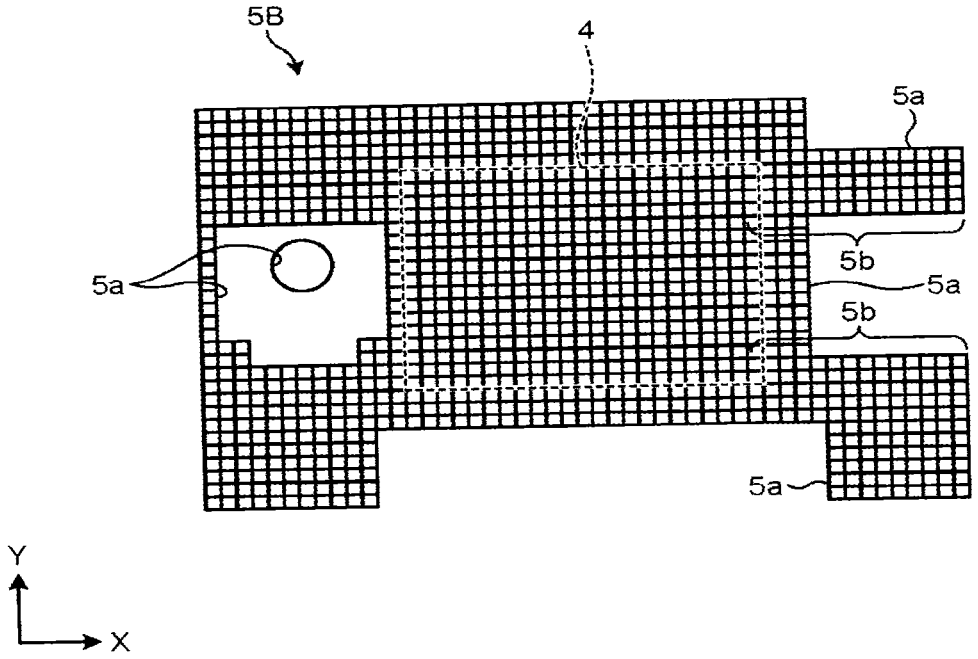
FIG. 9 is an exemplary schematic plan view illustrating a heat dissipation member including the heat dissipation member according to the third embodiment.

FIG. 8 is an exemplary schematic side view illustrating a board assembly including a heat dissipation member according to a third embodiment. FIG. 9 is an exemplary schematic plan view illustrating a heat dissipation member including the heat dissipation member according to the third embodiment. A heat dissipation member 5B according to the third embodiment illustrated in FIGS. 8 and 9 also has a multi-layer structure and a framework structure (three-dimensional lattice shape) same as a heat dissipation member 5 of a first embodiment and a heat dissipation member 5A of a second embodiment. Therefore, same effects based on the same structures as the first embodiment and second embodiment can be also obtained in an electronic device 1B according to the present embodiment. However, a slope 5b is provided at the heat dissipation member 5B according to the present embodiment. The slope 5b is provided at an end portion 5b1 on a side opposite to a face 3a of a circuit board 3. The slope 5b is a portion (area) in which a distance in a Z-direction from the face 3a of the circuit board 3 to the end portion 5b1 is gradually reduced in a direction along the face 3a, more specifically, an X-direction or Y-direction, and a rightward direction in the example in FIG. 8. Further, in the heat dissipation member 5B, the slope 5b is provided in an area apart from an electronic component 4 in the case of viewing from the Z-direction (planar view). Further, as a position approaches to the electronic component 4, a distance from the face 3a of the circuit board 3 to the slope 5b is gradually increased in a direction along the face 3a, more specifically, the X-direction or the Y-direction, and a leftward direction in the example in FIG. 8. With this structure, air can be flown along a pitch of the slope 5b. Therefore, resistance of the air can be reduced, compared to a case of not providing the slope 5b. In this case, a flow rate is suppressed from being decreased. Therefore, a cooling effect by the air flow may be increased. In the example of FIG. 8, in the case where the air flow along the face 3a of the circuit board 3 is generated from the right side of FIG. 8, the air flow can be smoothly led to the end portion 5c of the heat dissipation member 5B which is at a side opposite to the electronic component 4. In this case, for example, swirl is prevented from being generated, compared to the case of not providing the slope 5b. As a result, the flow speed of the air flow tends to be increased at the end portion 5c. Therefore, according to this structure, not only a cooling effect of the heat dissipation member 5B by the air flow but also a heat dissipation effect by the heat dissipation member 5B are more easily increased. Note that a slope angle and a slope direction of the slope 5b are set in various manners.

Further, an opening 5a (first opening) is also provided at the heat dissipation member 58B of the present embodiment. According to the present embodiment, interference between a component (not illustrated) and the heat dissipation member 5B is prevented by the opening 5a. In other words, clearance is provided between the component and the heat dissipation member 5B by the opening 5a. According to the present embodiment, effects by the opening 5a same as the second embodiment can be also obtained.

Fourth Embodiment

Figure 10:
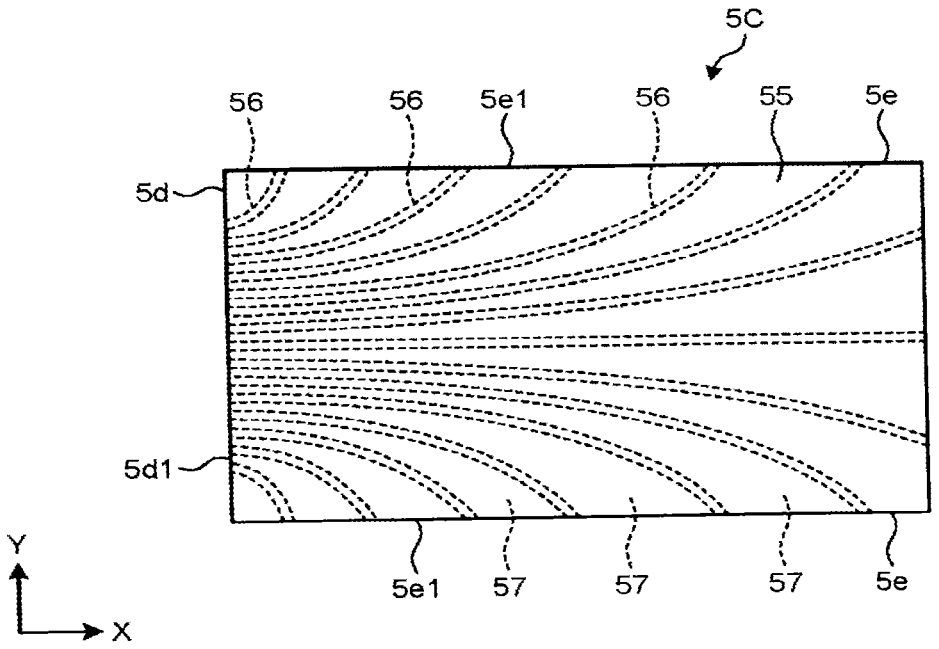
FIG. 10 is an exemplary schematic plan view illustrating a heat dissipation member according to a fourth embodiment.
Figure 11:
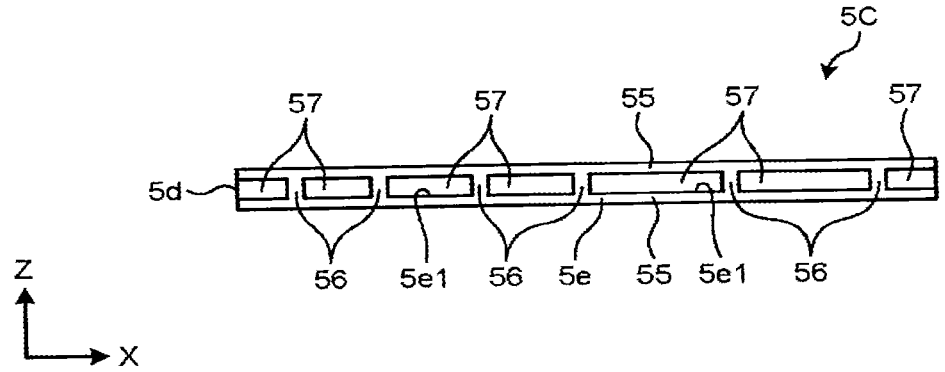
FIG. 11 is an exemplary schematic side view illustrating the heat dissipation member according to the fourth embodiment.

FIG. 10 is an exemplary schematic plan view illustrating a heat dissipation member according to a fourth embodiment. FIG. 11 is an exemplary schematic side view illustrating the heat dissipation member according to the fourth embodiment. A heat dissipation member 5C of the fourth embodiment illustrated in FIGS. 10 and 11 also has a multi-layer structure same as a heat dissipation member 5 of a first embodiment, a heat dissipation member 5A of a second embodiment, and a heat dissipation member 5B of a third embodiment described above. Therefore, same effects based on the same structure as the first embodiment, second embodiment, and third embodiment can also be obtained in an electronic device including the heat dissipation member 5C according to the present embodiment. The heat dissipation member 5C can be incorporated instead of the heat dissipation members 5, 5A, 5B, 5D, 5E of electronic devices 1, 1A, 1B, 1D, 1E of other embodiments, for example. However, in the heat dissipation member 5C according to the present embodiment, respective layers 55 are not lattice-shaped (mesh-shaped) but are plate-shaped walls. Further, a plate-shaped wall 56 extended in a Z-direction is disposed between the two layers 55, 55 instead of a column-shaped (bar-shaped) frame 53. Space is interposed between a plurality of the layers 55, and space is also interposed between a plurality of the walls 56. Among the two layers 55, 55 apart from each other in the Z-direction by a space, the layer 55 close to an electronic component 4 is a first extending portion and also a wall, and the other layer 55 distant from the electronic component 4 is a second extending portion and also a wall. Further, the wall 56 is a third extending portion. Additionally, an air passage 57 surrounded by the two layers 55, 55 and two walls b6, 56 is formed inside the heat dissipation member 5C. The air passage 57 extends in a direction orthogonal to the Z-direction, more specifically, along an XY-plane, and penetrates the inside of the heat dissipation member 5C. According to the present embodiment, heat exchange is executed between the heat dissipation member 5C and the air flowing inside the air passage 57, and furthermore, temperature at the electronic component 4 may be decreased. According to the air passage 57 surrounded by the walls like the present embodiment, the air can flow more smoothly, and efficiency of heat dissipation by the air may be more improved. Further, as for the air passage 57, an air flow area and a direction thereof can be set by a layout and shapes of the walls 56 in various manners. For instance, the air passage 57 may be provided at a portion having a large heat receiving amount from the electronic component 4, density of the air passage 57 at the portion having the large heat receiving amount may be increased more than at a potion having a small heat receiving amount, the air passage 57 may be set at a position and a direction in which the air can be easily introduced, or the air passage 57 may be set at a position and a direction in which the air can be easily discharged. As an example according to the present embodiment, as illustrated in FIG. 10, the wall 56 and the air passage 57 are curved along a face 3a, more specifically, along the XY-face and are extended between an end portion 5d (side portion, edge portion, first end portion) of the heat dissipation member 5C and the other end portion 5e (side portion, edge portion, second end portion) in the case of viewing from the Z-direction. The air passage 57 is opened at an opening end 5d1 in the end portion 5d, and opened at an opening end 5e1 in the end portion 5e. Further, a plurality of air passages 57 extends radially from the end portion 5d. In this case, an exhaust port of a fan (not illustrated) is disposed facing the end portion 5d, and air flow discharged from the fan may be flown along the plurality of air passages 57 so as to be radially expanded. The air flow in the air passage 57 is not limited to, for example, a forced flow by the fan or the like disposed inside a housing 2, and may be generated by natural convection or the like generated along with heat generation, etc. inside the housing 2. Note that a plurality of frames 53 may be provided at the heat dissipation member 5C instead of the wall 56 between the plate-shaped layers 55, 55, or the plate-shaped wall 56 may be provided between the layers 55, 55 partially or entirely formed of the mesh-like framework structure. Further, an opening such as a through hole, a slit, a notch, and a recessed portion (not illustrated) may be partially or entirely provided at the layer 55 and the wall 56 such that the air or other refrigerant can effectively flow in the air passage 57 within a range where space for disposing the heat dissipation member can be secured, or such that a certain size of a contact face with the refrigerant can be secured. According to this embodiment, as illustrated in FIG. 12, the opening 2b is an example of a second opening, an opening 2b1 is an example of one of the plurality of the second openings, an opening 2b2 is an example of the other of the plurality of the second openings, an opening 2b3 is an example of a third opening, an air passage 571 is an example of a first air passage, an air passage 572 is an example of a second air passage, an air passage 573 is an example of a third air passage, an opening end 5d1a is an example of a first opening end of the air passage 571, an opening end 5d1b is an example of a first opening end of the air passage 572, an opening end 5d1c is an example of a first opening end of the air passage 573, an opening end 5d1d is an example of a second opening end of the air passage 573, an opening end 5e1a is an example of a second opening end of the air passage 571, and an opening end 5e1b is an example of a second opening end of the air passage 572.

Modified Example of Fourth Embodiment

Figure 12:
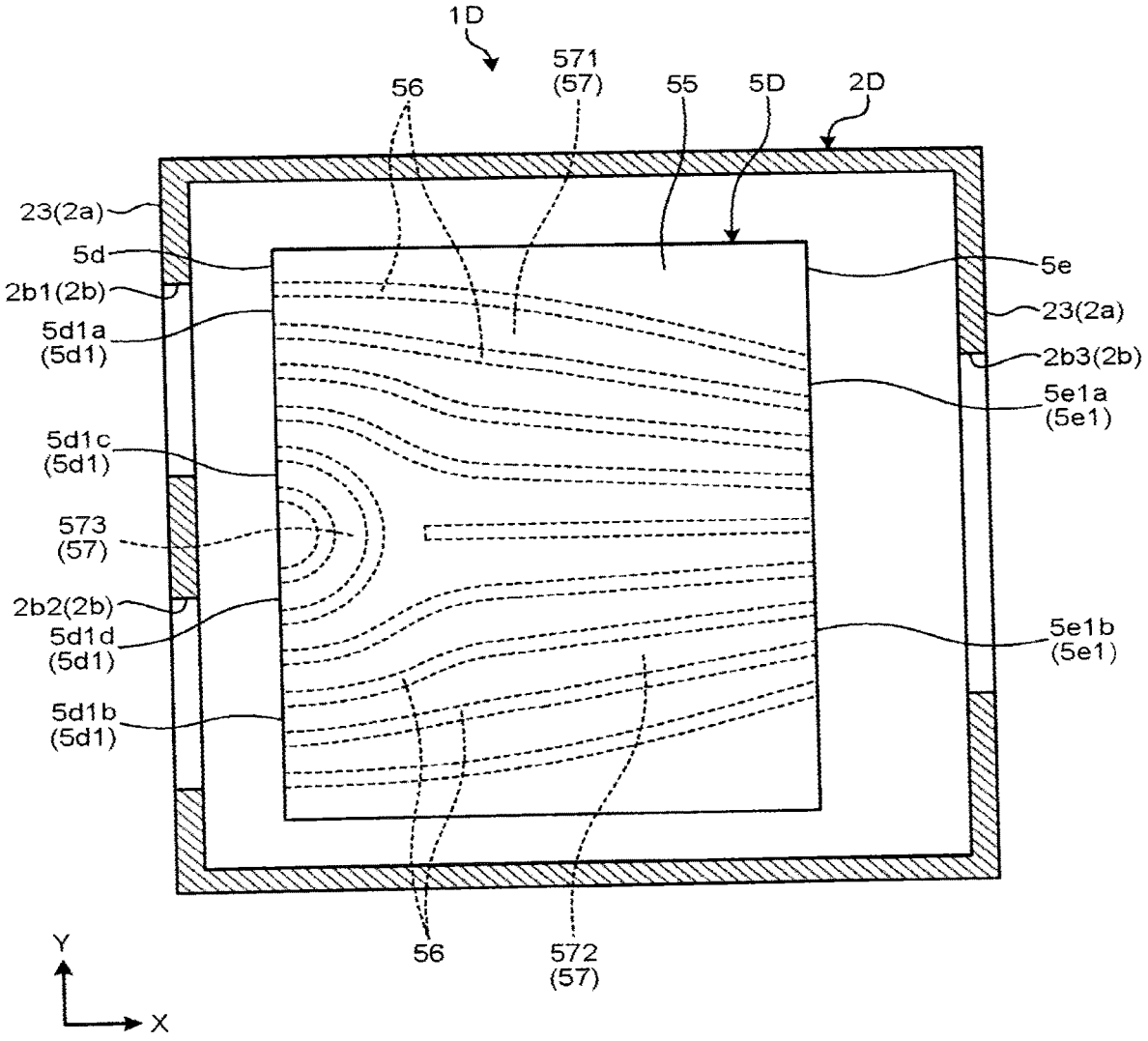
FIG. 12 is an exemplary schematic plan view illustrating a heat dissipation member according to a modified example of the fourth embodiment.

FIG. 12 is an exemplary schematic plan view illustrating a heat dissipation member according to a modified example of a fourth embodiment. A heat dissipation member 5D according to the modified example of the fourth embodiment illustrated in FIG. 12 also has a structure same as a heat dissipation member 5C of the fourth embodiment, and an air passage 57 same as the heat dissipation member 5C is formed at the heat dissipation member 5D. Therefore, same effects based on the same structure as the fourth embodiment can be also obtained in an electronic device 1D according to the present embodiment. However, the heat dissipation member 5D of the present embodiment differs from the heat dissipation member 5C of the fourth embodiment in a point of having a different shape of the air passage 57. More specifically, according to the present modified example, an opening end 5d1 on one side of the air passage 57 and an opening end 5e1 on the other side are respectively oriented to openings 2b provided at walls 2a (23) of a housing 2D. The openings 2b penetrate the interior and the exterior of the housing 2D. Therefore, according to the present modified example, air can easily enter the inside of the air passage 57 from the outside of the housing 2D via the openings 2b of the housing 2D, and further the air can easily flow out from the inside of the air passage 57 to the outside of the housing 2D via the openings 2b of the housing 2D. Accordingly, heat exchange is more accelerated between the heat dissipation member 5D and an air flow. Further, in the heat dissipation member 5D according to the present modified example, the opening ends 5d1, 5e1 of the air passage 57 can be located so as to face the openings 2b of the housing 2D. In other words, the openings 2b can be located at the wall 2a of the housing 2D so as to face the opening ends 5d1, 5e1 of the air passage 57. The air passage 57 is curved between the opening ends 5d1, 5e1 facing the two different openings 2b. The openings 2b are examples of a second opening. Further, according to the present modified example, a plurality of openings 2b faces an end portion 5d on one side of the heat dissipation member 5D, and one of the openings 2b faces an end portion 5e on the other side of the heat dissipation member 5D as an example. Thus, even in the case where the plurality of openings 2b of the housing 2D is unsymmetrically provided, the openings 2b of the housing 2D and the opening ends 5d1, 5d2 of the heat dissipation member 5D can face each other by setting a layout and a shape of the air passage 57 in the heat dissipation member 5D.

Fifth Embodiment

Figure 13:
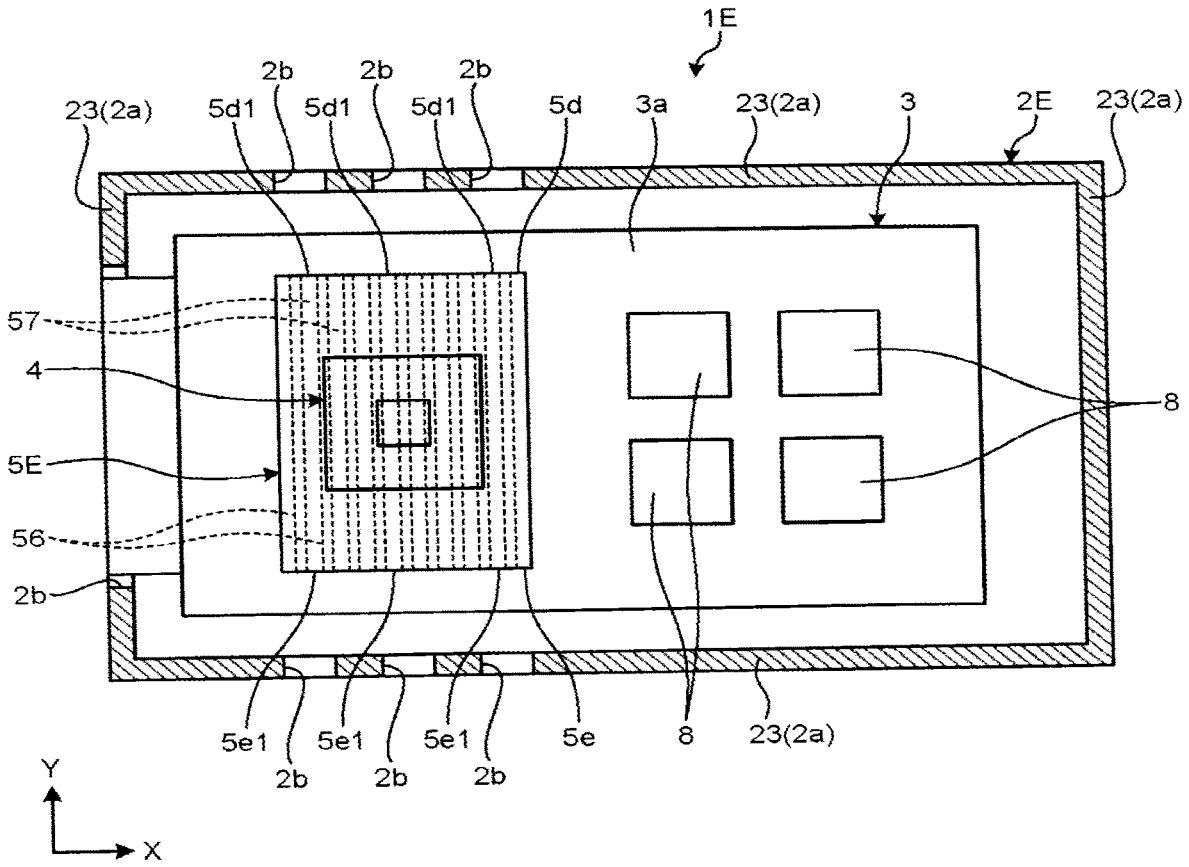
FIG. 13 is an exemplary schematic plan view illustrating an inner portion of an electronic device according to a fifth embodiment.

FIG. 13 is an exemplary schematic plan view illustrating an inner portion of an electronic device according to a fifth embodiment. A heat dissipation member 5E according to a fifth embodiment illustrated in FIG. 13 also has a structure same as a heat dissipation member 5C of a fourth embodiment and a heat dissipation member 5D of a modified example of the fourth embodiment, and an air passage 57 same as the heat dissipation members 5C, 5D of the fourth embodiment is formed at the heat dissipation member 5E. Therefore, same effects based on the same structure as the fourth embodiment and the modified example of the fourth embodiment can be also obtained in an electronic device 1E according to the present embodiment. However, according to the present embodiment, an electronic component 4 provided with the heat dissipation member 5E and an electronic component 8 not provided with the heat dissipation member 5E are disposed on a circuit board 3. The electronic component 8 is, for example, a memory or a data buffer of an SSD, and the electronic component 4 is, for example, a controller of the SSD. The electronic component 4 is disposed on one side (left side in FIG. 13) in an X-direction (first direction) of the circuit board 3, and the electronic component 8 (third electronic component) is disposed on the other side (right side in FIG. 13) in the X-direction of the circuit board 3. In the heat dissipation member 5E, an air passage 57 penetrating between an end portion 5d and an end portion 5e along a Y-direction (second direction). An opening end 5d1 on one side (upper side in FIG. 13) in the Y-direction of the air passage 57 faces an opening 2b located at a wall 2a (23) on one side of a housing 2E, and an opening end 5e1 on the other side (lower side in FIG. 13) in the Y-direction of the air passage 57 faces an opening 2b located at a wall 2a on the other side of the housing 2E. In this case, the opening ends 5d1, 5e1 and the openings 2b face, for example, the Y-direction, more specifically, an extended direction of the air passage 57, a thickness direction of the walls 2a where the openings 2b are provided, and a penetrating direction of the openings 2b at the walls 2a. According to the present embodiment, the electronic component 4 can be more effectively cooled. Further, air passing through the air passage 57 and heated by the electronic component 4 does not affect the electronic component 8. Therefore, the electronic component 8 is hardly heated. Note that a direction of disposing the electronic components 4, 8 (first direction) and an extending direction of the air passage 57 (second direction) are not necessarily orthogonal to each other as long as the directions intersect each other. Further, not limited to the examples in FIGS. 10 to 13, specification of the air passage 57 can be set in various manners.

While the present embodiments and modified example have been exemplified above, the present embodiments and modified example are examples and not intended to limit the scope of the invention. The present embodiments and modified example can be implemented in other various modes, and various kinds of omission, replacement, combination, and change can be made in the scope without departing from the gist of the present invention. The present embodiments and modified example are included in the scope and gist of the invention and further included in the scope equivalent to the inventions recited in the scope of claims. Further, the structures and shapes in the respective present embodiments and modified example can be partially switched for implementation. Additionally, the specification such as the respective structures and shapes (structure, type, direction, shape, size, length, width, thickness, height, number, arrangement, position, material, etc.) can be suitably changed for implementation.

What is claimed is:

[1. An electronic device comprising:

a board having a first face;

a first electronic component disposed on the first face; and a heat dissipation member disposed at a side opposite to the first face of the first electronic component, the heat dissipation member being thermally connected to the first electronic component, the heat dissipation member including a first extending portion, a second extending portion, and a plurality of third extending portions, wherein the first extending portion extends along the first face, the second extending portion is positioned away, in a direction that intersects the first face, from the first extending portion by a space, the second extending portion extending along the first face, and the plurality of third extending portions are connected to the first extending portion and the second extending portion, the plurality of third extending portions being positioned away from each other by a space.]

[2. The electronic device according to claim 1, wherein the heat dissipation member has a framework structure, and the framework structure includes the first extending portion, the second extending portion, and the plurality of third extending portions.]

[3. The electronic device according to claim 2, wherein the first extending portion includes a plurality of row portions and a plurality of column portions, the plurality of row portions are disposed away from each other, the plurality of column portions intersect the row portions, the plurality of column portions being disposed away from each other.]

[4. The electronic device according to claim 3, wherein the plurality of third extending portions connect a connecting portion, the connecting portion being a portion via which the row portion and the column portion are connected.]

[5. The electronic device according to claim 4, comprising a housing that houses the board, the first electronic component, and the heat dissipation member.]

[6. The electronic device according to claim 1, comprising a second electronic component disposed on the board, wherein the heat dissipation member is thermally connected to the first electronic component and to the second electronic component.]

[7. The electronic device according to claim 1, wherein the heat dissipation member has a first opening, the first opening being configured to provide clearance between the heat dissipation member and a component, the component being disposed on the first face.]

[8. The electronic device according to claim 7, wherein the first opening is a through hole that penetrates the heat dissipation member.]

[9. The electronic device according to claim 1, wherein the heat dissipation member includes a slope at a side opposite to the first face, and a distance from the first face to the slope decreases in a direction along the first face.]

[10. The electronic device according to claim 1, wherein the first extending portion, the second extending portion, and the plurality of third extending portions are walls, and a plurality of air passages that are surrounded by the first extending portion, the second extending portion, and two third extending portions among the plurality of third extending portions, the plurality of air passages penetrating the heat dissipation member is provided in the heat dissipation member.]

[11. The electronic device according to claim 10, wherein the plurality of air passages are curved.]

[12. The electronic device according to claim 10, comprising a housing that houses the board, the first electronic component, and the heat dissipation member, wherein the housing has a second opening, the second opening penetrating an interior and an exterior of the housing, the plurality of air passages extend in a direction along the first face, and an opening end of the air passages face the second opening.]

[13. The electronic device according to claim 10, comprising a housing that houses the board, the first electronic component, and the heat dissipation member, wherein the housing includes two walls that are disposed away from each other in a direction along the first face, a first opening end of a first passage among the plurality of passages and a first opening end of a second passage among the plurality of passages are located at a first end portion of the heat dissipation member in the direction along the first face, a plurality of second openings that are pr-vided through one wall among the two walls of the housing, the plurality of second openings penetrating an interior and an exterior of the housing, and the first opening end of the first passage faces one of the plurality of second openings, and the first opening end of the second passage faces another opening among the plurality of second openings.]

[14. The electronic device according to claim 13, wherein a second opening end of the first passage and a second opening end of the second passage are located at a second end portion of the heat dissipation member, the second end portion being at a side opposite to the first end portion in a direction along the first face, a third opening is provided at the other wall among the two walls of the housing, the third opening penetrating an interior and an exterior of the housing, and both the second opening end of the first passage and the second opening end of the second passage face the third opening.]

[15. The electronic device according to claim 10, comprising a housing that houses the board, the first electronic component, and the heat dissipation member, wherein the housing includes two walls that are disposed away from each other in a direction along the first face, a plurality of second openings that are provided through one wall among the two walls of the housing, the plurality of second openings penetrating an interior and an exterior of the housing, a first opening end of a third passage among the plurality of passages and a second opening end of the third passage are located at the first end portion of the heat dissipation member in the direction along the first face, and the first opening end of the third passage faces one of the plurality of second openings, and the second opening end of the third passage faces another opening among the plurality of second openings.]

[16. The electronic device according to claim 12, wherein the housing includes two walls disposed away from each other in a direction along the first face, and one of the opening ends of the air passage faces one of the two walls, and the other of the opening ends of the air passage faces the other wall among the two walls.]

[17. The electronic device according to claim 16, comprising a third electronic component that is disposed on the board, the third electronic component being disposed away from the heat dissipation member, wherein the third electronic component is positioned at a first direction side of the first electronic component, and the air passage extends along a second direction that intersects the first direction.]

[18. The electronic device according to claim 17, wherein the third electronic component is a NAND flash memory, and the first electronic component is a controller that controls the NAND flash memory.]

*19. An electronic device comprising:*

*a board having a first face;*

*a first electronic component disposed on the first face;*

*a second electronic component disposed on the first face and disposed at a first distance from the first electronic component;*

*a third electronic component disposed between the first and second electronic components; and*

*a heat dissipation member disposed at a side opposite to a contact surface of the first electronic component with the board, the heat dissipation member being thermally connected to the first electronic component and to the second electronic component, the heat dissipation member including a first extending portion, a second extending portion, and a plurality of third extending portions, wherein*

*the first extending portion extends along the first face,*

*the second extending portion is positioned away, in a direction that intersects the first face, from the first extending portion by a space, the second extending portion extending along the first face, and the second extending portion being thermally connected to the first extending portion,*

*the plurality of third extending portions respectively extend from the first extending portion, the plurality of third extending portions being positioned away from each other,*

*a first opening is provided in the first extending portion,*

*a fourth electronic component is provided in the first opening;*

*a second opening is provided between end portions of the first extending portion and second extending portion,*

*a passage connects the first and second openings,*

*at least one of the third extending portions is a wall extending in a direction from the second opening to the first opening in a plan view,*

*in a plan view, a first number of the plurality of third extending portions are provided in a region where the first electronic component is located and are separated from each other, and*

*a second number of the plurality of third extending portions are provided in a region where the second electronic component is located and are separated from each other.*

*20. An electronic device comprising:*

*a board having a first surface;*

*a first electronic component having a second surface and a third surface opposite to the second surface, the second surface being disposed on the first surface of the board; and*

*a heat dissipation member disposed on the third surface of the first electronic component, the heat dissipation member including a first extending portion, a second extending portion, and a plurality of third extending portions,*

*the first extending portion contacting with the third surface of the first electronic component, the first extending portion extending along the first surface of the board, the first extending portion having a first end and a first opening,*

*the second extending portion being positioned away from the first extending portion by a space in a first direction that is a thickness direction of the board, the second extending portion extending along the first surface of the board, the second extending portion having a second end,*

*the plurality of third extending portions respectively extending from the first extending portion to the second extending portion, the plurality of third extending portions being positioned away from each other by a space, wherein*

*a second opening is formed with the first end of the first extending portion and the second end of the second extending portion.*

*21. The electronic device according to claim 20, further comprising:*

*a passage that connects the first opening of the first extending portion and the second opening.*

*22. The electronic device according to claim 20, wherein*

*at least one of the plurality of third extending portions is a wall extending in a direction from the first opening of the first extending portion to the second opening.*

*23. The electronic device according to claim 20, further comprising:*

*a wall having a third opening, wherein*

*the wall is positioned away from the second extending portion in a second direction that intersects with the first direction, and*

*the third opening of the wall faces the second opening.*

*24. The electronic device according to claim 20, further comprising:*

*a second electronic component disposed on the first surface of the board, wherein*

*the second electronic component is exposed through the first opening of the first extending portion.*

*25. The electronic device according to claim 24, wherein a height of the second electronic component is larger than a height of the first electronic component.*

*26. The electronic device according to claim 20, wherein the second extending portion further has a fourth surface and a fifth surface opposite to the fourth surface,*

*the fourth surface is a surface to which the plurality of third extending portions respectively extend, and*

*the fifth surface is flat.*

*27. The electronic device according to claim 20, wherein at least one of the plurality of third extending portions has a first portion and a second portion,*

*the first portion extends from the first extending portion to the second extending portion, and*

*the second portion extends along the first surface of the board.*

*28. The electronic device according to claim 20, wherein the first extending portion has a first region and a second region,*

*a density of the plurality of third extending portions in the first region of the first extending portion is different from a density of the plurality of third extending portions in the second region of the first extending portion.*

*29. The electronic device according to claim 20, wherein the plurality of third extending portions include a fourth extending portion, and*

*the fourth extending portion is curved when seen from the first direction.*

*30. The electronic device according to claim 29, wherein the first extending portion further has a first edge and a second edge parallel to the first edge, and*

*the fourth extending portion extends from the first edge to the second edge.*

*31. The electronic device according to claim 29, wherein the first extending portion further has a first edge and a third edge perpendicular to the first edge, and*

*the fourth extending portion extends from the first edge toward the third edge.*

*32. The electronic device according to claim 20, wherein the first extending portion further has a first edge and a second edge parallel to the first edge,*

*the plurality of third extending portions include a fifth extending portion and a sixth extending portion,*

*the fifth extending portion extends along the first surface of the board between the first edge and the first opening, and*

*the sixth extending portion extends along the first surface of the board between the second edge and the first opening.*

*33. The electronic device according to claim 20, wherein the first opening has four edges, and*

*at least three of the plurality of third extending portions face at least one of the four edges of the first opening.*

*34. The electronic device according to claim 20, wherein the first extending portion, the second extending portion, and the plurality of third extending portions are walls, and*

*at least one air passage that is defined by the first extending portion, the second extending portion, and two of the plurality of third extending portions is provided in the heat dissipation member.*

*35. The electronic device according to claim 34, wherein the at least one air passage is curved when seen from the first direction.*

*36. The electronic device according to claim 35, wherein the first extending portion further has a first edge and a second edge parallel to the first edge, and*

*the at least one air passage extends from the first edge to the second edge.*

*37. The electronic device according to claim 35, wherein the first extending portion further has a first edge and a third edge perpendicular to the first edge, and*

*the at least one air passage extends from the first edge toward the third edge.*

*38. The electronic device according to claim 34, wherein the first extending portion further has a first edge and a second edge parallel to the first edge,*

*the at least one air passage is one of a plurality of air passages that include at least a first air passage and a second air passage,*

*the first air passage extends along the first surface of the board between the first edge and the first opening, and*

*the second air passage extends along the first surface of the board between the second edge and the first opening.*

*39. The electronic device according to claim 34, wherein the first opening has four edges,*

*the at least one air passage is one of a plurality of air passages, and*

*at least two of the plurality of air passages face at least one of the four edges of the first opening.*

* * * * *